United States Patent [19]

Kobayashi et al.

[11] 4,316,208
[45] Feb. 16, 1982

[54] LIGHT-EMITTING SEMICONDUCTOR DEVICE AND METHOD OF FABRICATING SAME

[75] Inventors: Hiroyuki Kobayashi; Masafumi Hashimoto, both of Kawasaki, Japan

[73] Assignee: Matsushita Electric Industrial Company, Limited, Osaka, Japan

[21] Appl. No.: 155,007

[22] Filed: May 30, 1980

Related U.S. Application Data

[63] Continuation of Ser. No. 916,253, Jun. 16, 1978, abandoned.

[30] Foreign Application Priority Data

Jun. 17, 1977 [JP] Japan ................................ 52-72417

[51] Int. Cl.³ .................... H01L 29/06; H01L 23/48; H01L 29/44
[52] U.S. Cl. ........................................ 357/55; 357/17; 357/68; 357/67; 357/71
[58] Field of Search .................. 357/17, 55, 68, 71, 357/67

[56] References Cited

U.S. PATENT DOCUMENTS

| | | | |
|---|---|---|---|
| 3,307,049 | 2/1967 | Bernuth et al. | 357/55 |
| 3,384,793 | 5/1968 | Moriyama | 357/68 |
| 3,517,278 | 6/1970 | Hager | 357/71 |
| 3,526,815 | 9/1970 | Svedberg et al. | 357/86 |
| 3,593,070 | 7/1971 | Reed | 357/17 |
| 3,611,065 | 10/1971 | Zschauer | 357/17 |
| 3,761,782 | 9/1973 | Youmans | 357/55 |
| 3,950,233 | 4/1976 | Rosvold | 357/55 |
| 4,097,887 | 6/1978 | Kalkbrenner | 357/86 |
| 4,097,890 | 6/1978 | Morris et al. | 357/68 |
| 4,122,486 | 10/1978 | Ono et al. | 357/17 |

Primary Examiner—Andrew J. James
Attorney, Agent, or Firm—Lowe, King, Price & Becker

[57] ABSTRACT

A light-emitting semiconductor device of the type having a substrate, a first layer of a semiconductor on the substrate and a second layer of a different conductivity on the first layer. The second layer is selectively voided so as to give a recess and leave the first layer uncovered in a region serving as the bottom of the recess. An ohmic electrode layer is selectively formed on the second layer so as to extend into the recess and contact with the uncovered region of the first layer, and another ohmic electrode layer is selectively formed on the second layer so as to be separated from the former electrode layer. A solder bump is built up on the first electrode layer to fill up the recess and another solder bump on the second electrode layer so as to be separated from the former solder bump. Selective voiding of the second layer is accomplished by initially covering the entire area of the first layer with the second layer and then selectively slotting the second layer to a depth greater than the thickness of the second layer.

16 Claims, 15 Drawing Figures

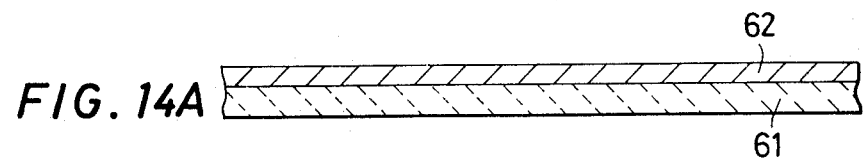
FIG. 14A
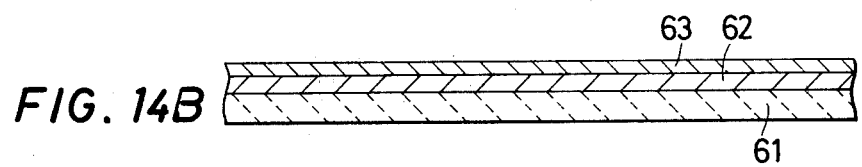
FIG. 14B
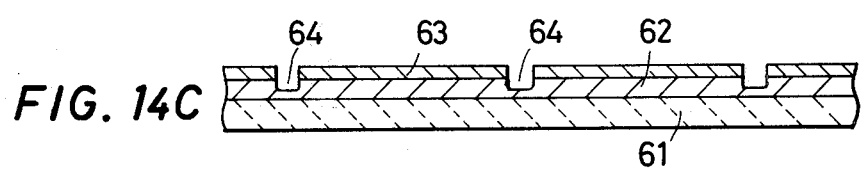
FIG. 14C
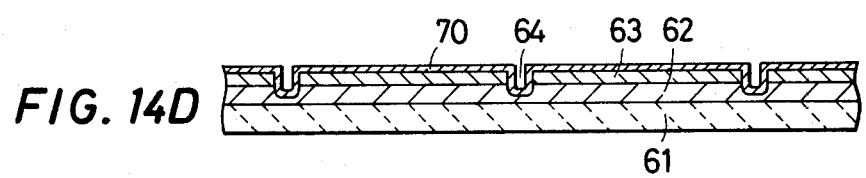
FIG. 14D
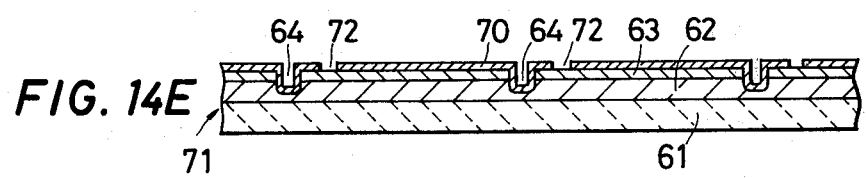
FIG. 14E
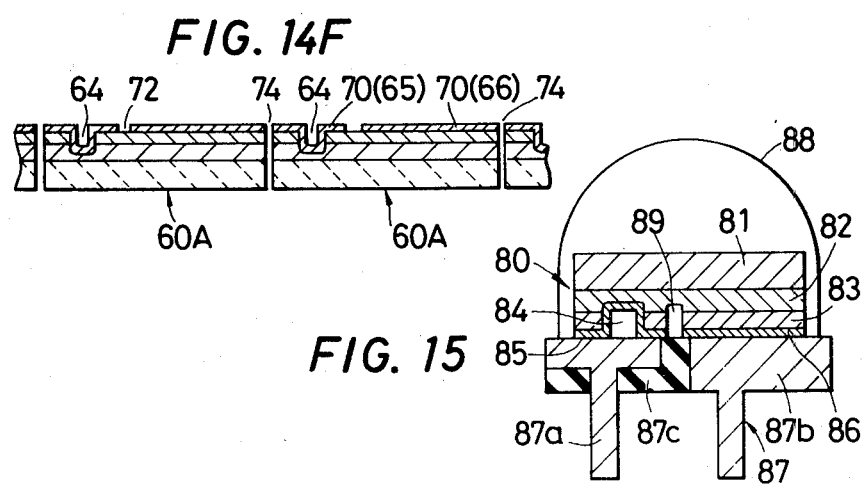
FIG. 14F
FIG. 15

LIGHT-EMITTING SEMICONDUCTOR DEVICE AND METHOD OF FABRICATING SAME

This is a continuation of application Ser. No. 916,253 filed June 16, 1978, now abandoned.

BACKGROUND OF THE INVENTION

This invention relates to a light-emitting semiconductor device, in which ohmic contacts of two polarities are made substantially on the same surface of a semiconductor chip without using any wire, and a method of fabricating the same.

Conventional light-emitting semiconductor devices generally adopt wire bonding to make an ohmic contact. In a p-n junction device two ohmic electrodes are formed respectively on the front and back sides of the device, so that a fine wire needs to be attached to one of the electrodes to connect it, for example, to a terminal post while the other electrode can be brought into face-to-face contact with a surface of a stem. In a device in which a junction is formed between an n-type layer and a semi-insulating layer, an ohmic contact is made to the side face of the n-type layer by attaching a fine wire thereto.

The employment of wire bonding causes inconvenience to the fabrication of the devices, particularly significantly for devices comprising a number of light-emitting semiconductor chips, and places various restrictions on the design of lenses for the devices and stems or boards on which light-emitting semiconductor chips are mounted. Furthermore, the products often suffer from insufficient reliability.

Recently there is an increasing demand for high reliability light-emitting semiconductor devices which do not employ wire bonding but nevertheless are comparable to conventional devices of the wire bonding type both in cost and performance. The demand would be met by providing light-emitting semiconductor chips of flip-chip structure with solder bumps if industrial fabrication of such chips is easier than the fabrication of silicon devices of the same type. However, development of such chips has encountered various difficulties because, unlike silicon planer devices, light-emitting semiconductor chips generally do not allow the provision of two electrodes on the same plane and are devoid of a protective coating of an insulating material such as $SiO_2$. Another problem is that gold alloy electrodes of conventional light-emitting semiconductor chips are liable to melt into solder during buidup of solder bumps. In the case of applying a solder bump technique used for silicon devices to light-emitting semiconductor chips, therefore, the electrodes of the chips are required of a multi-layer structure and a photolithographic process needs to be repeated several times.

SUMMARY OF THE INVENTION

It is an object of the invention to provide a light-emitting semiconductor device which employs no wire bonding and accordingly surpasses conventional light-emitting semiconductor devices in reliability, productivity and workability.

It is another object of the invention to provide a light-emitting semiconductor device comprising a semiconductor chip of flip-chip structure provided with solder bumps.

It is still another object of the invention to provide a method of fabricating a light-emitting semiconductor device according to the invention.

A light-emitting semiconductor device according to the invention comprises a substrate, a first layer of a semiconductor formed on the substrate and a second layer which is formed on the first layer and is different in conductivity from the first layer. The second layer is selectively voided so as to give a recess and leave the first layer uncovered in a region serving as the bottom of the recess. The device further comprises a first electrode layer selectively covering the second layer so as to extend into the recess and contact with the uncovered region of the first layer, a second electrode layer selectively covering the second layer so as to be separated from the first electrode layer, a first solder bump built up on the first electrode layer so as to fill up the recess and a second solder bump built up on the second electrode layer so as to be separated from the first solder bump.

The first and second layers of this device may be respectively an n-type semiconductor layer and a semi-insulating layer distinctly higher in resistivity than the first layer. Alternatively, the first and second layers may be respectively an n-type semiconductor layer and a p-type semiconductor layer. In the latter case, the second layer is selectively formed such that the first layer is left uncovered also in a region partitioning the second electrode layer from the first electrode layer.

Since both the first and second electrodes are formed each with the provision of a solder bump on the outer surface of the second layer, this semiconductor device does not need to employ wire-bonding and accordingly is high in reliability and productivity. Besides, mounting of a semiconducting chip in this device, for example, on a lead frame or a printed board can be accomplished quite easily, so that large freedom is afforded to the arrangement of, for example, a light reflector and/or a light refractor.

A light-emitting semiconductor device of the invention is fabricated through the following steps. The first layer is formed on a substrate and the second layer is formed on the first layer in the entire region thereof. Then the second layer is selectively removed so as to give a recess having a depth greater than the thickness of the second layer. This results in the exposure of the first layer at the bottom of the recess. The first electrode layer is formed on the second layer so as to extend into the recess and contact with the exposed region of the first layer, and the second electrode layer is formed on the second layer. Then exposed surfaces of these electrode layers are coated with a protective metal layer. At least one of the first and second electrode layers is selectively removed such that these two electrode layers are separated from each other, and the first and second solder bumps are built up respectively on the first and second electrode layers with the interposal of the protective metal layer therebetween such that the first solder bump fills up the aforementioned recess and is separated from the second solder bump.

The selective removal of the first and/or second electrode layers can be accomplished in various manners. For example, the second electrode layer is formed so as to cover the first electrode layer and then locally removed at the outside of the recess together with the second layer. In the case where the aforementioned first and second layers are respectively an n-type semiconductor layer and a semi-insulating layer, the first and second electrode layers may be formed initially as a continuous single layer, which is selectively removed at the outside of the recess simultaneously with and/or subsequently to the buildup of the solder bumps.

In the case of a p-n junction device, the second layer is further removed selectively so as to provide another recess which has a depth greater than the thickness of the second layer and serves for real partitioning of the two electrode layers from each other. In this case the selective removal of the first and/or second electrode layers can be achieved by this procedure.

BRIEF DESCRIPTION OF THE DRAWINGS

FIGS. 14A-14F show sequential steps in the fabrication of the chip of FIG. 13; and FIG. 15 is a sectional view of a light-emitting semiconductor device according to the invention as a counterpart of the device of FIG. 5.

DESCRIPTION OF THE PREFERRED EMBODIMENT

The invention will first be illustrated by examples to facilitate clear understanding.

EXAMPLE 1

This example illustrates the fabrication of a p-n junction type light-emitting semiconductor chip according to the invention with reference to FIGS. 1A-1H.

Figure 1A:
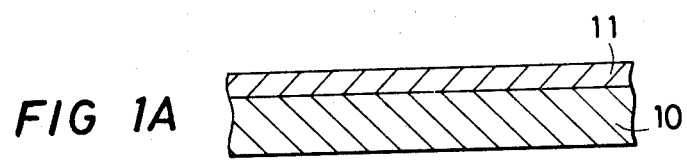
FIGS. 1A-1H show sequential steps in the fabrication of a light-emitting semiconductor chip according to the invention.
Figure 1B:
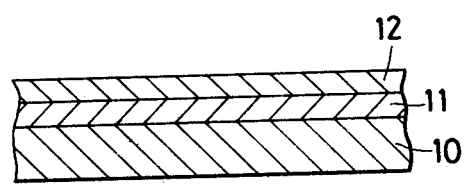

At the first step shown in FIG. 1A, an n-type GaP layer 11 was grown epitaxially on an n-type(may alternatively p-type) Gap substrate 10. Then a p-type layer 12 was formed on the n-type layer 11 as shown in FIG. 1B by epitaxial growth of p-type GaP doped with Zn and O. At the next step shown in FIG. 1C, a plurality of identical ohmic electrodes 13 for the p-type 12 were formed on this layer 12 selectively and at regular intervals by the use of either a Au-Be alloy or a Au-Zn alloy. Then the p-type layer 12 was selectively removed as shown in FIG. 1D such that a plurality of identical recesses 14, parallel slots in this case, were formed at the same intervals as the ohmic electrodes 13 each to alternate with each of the electrodes 13. The selective removal of the p-type layer 12 was made so deep that the depth of each recess 14 was greater than the thickness of the p-type layer 12, meaning that a surface portion of the n-type layer 11, too, was removed. This step could be accomplished either by mechanical dicing or by chemical etching.

Figure 1C:
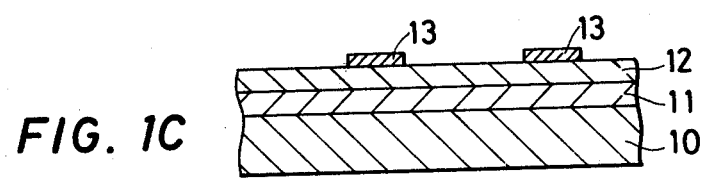
Figure 1D:
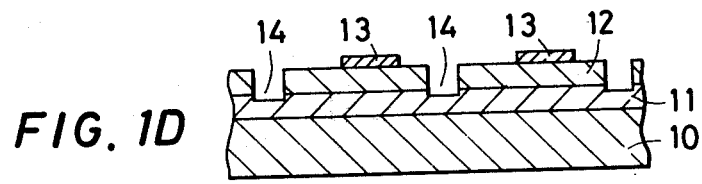
Figure 1E:
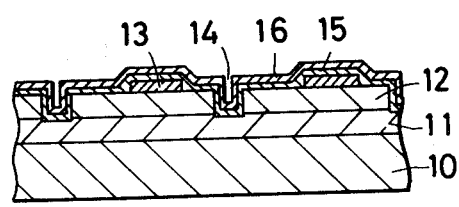

Referring to FIG. 1E, an n-type ohmic electrode layer 15 (an ohmic electrode for the n-type semiconductor layer 11) was formed on the entire surfaces of the p-type layer 12, ohmic electrodes 13 and the surfaces of the recesses 14 by the use of a suitable alloy such as a Au-Si alloy or a Au-Sn alloy. Thereafter this ohmic electrode layer 15 was entirely coated with a metal layer 16 such as of Ni or Cu either by plating or vacuum evaporation. This metal layer 16 was provided for the purpose of preventing the ohmic electrodes 13 and 15 from erosion during buildup of solder bumps as will be described hereinafter.

Figure 1F:
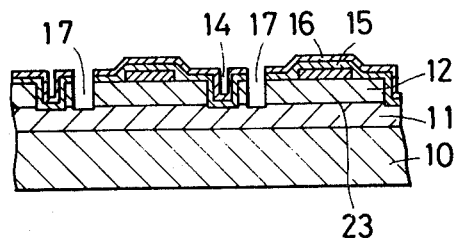
Figure 1G:
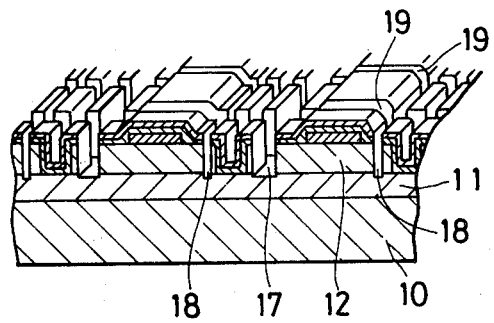

At the next step shown in FIG. 1F, the metal-coated p-type layer 12 was selectively removed so as to form a plurality of parallel slots 17 each at a short distance from each of the recesses 14. The depth of these slots 17 was great enough to remove a surface portion of the n-type layer 11, too. The slots 17 were formed for the purpose of interrupting the n-type ohmic electrode layer 15 between each recess 14 and each p-type ohmic electrode 13 and separating a p-n junction 23 from each recess 14, i.e. from n-type ohmic electrode 15. Therefore, the metal-coated p-type layer 12 was further slotted by mechanical dicing as seen in FIG. 1G so as to give a plurality of parallel slots 18, each extending between one of the recesses 14 and the nearest one of the p-type ohmic electrodes 13, and a plurality of parallel slots 19 extending crosswise to the slots 18. These crossing slots 18 and 19 were made somewhat deeper than the recesses 14. As a consequence, the p-type layer 12 was partitioned into a plurality of rectangular regions each containing a single recess 14, a single slot 17 and a single p-type ohmic electrode 13.

Figure 1H:
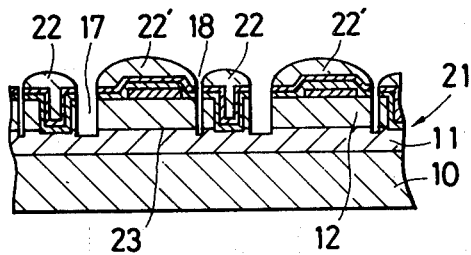

Referring to FIG. 1H, a wafer 21 obtained through the steps of FIGS. 1A-1G was dipped in a solder bath (not shown) to build up solder bumps 22 and 22' on the metal layer 16. As illustrated, each solder bump 22 filled up each recess 14 while each solder bump 22' was isolated from the solder bump 22 by the slot 18 and covered (with the interposal of the metal layers 15 and 16) each p-type ohmic electrode 13. At this step, the alloy layers 13 and 15 were protected against contact with the solder by the metal layer 16. By way of example, a 60%Sn-40%Pb solder was used for this process.

Figure 2:
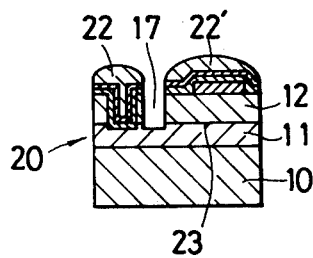
FIG. 2 is a sectional view of a light-emitting semiconductor chip obtained through the steps of FIGS. 1A-1H.

Finally the wafer 21 was diced completely along the crossing slots 18 and 19 into a plurality of rectangular chips 20 as shown in FIG. 2. When a negative voltage was applied to the solder bump 22, i.e. to the n-type ohmic electrode 15, and a positive voltage to the other solder pump 22', i.e. to the p-type ohmic electrode 13, this chip 20 emitted red light in the vicinity of a p-n junction 23 formed beneath the solder bump 22'.

Figure 3:
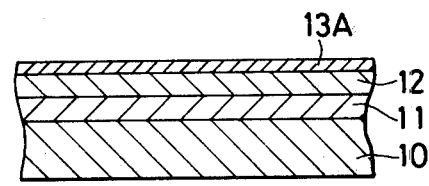
FIG. 3 shows a slight modification of the step shown in FIG. 1C.
Figure 4:
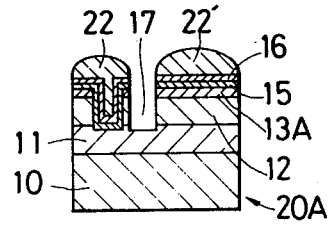
FIG. 4 is a sectional view of a light-emitting semiconductor chip resulting from the modification shown in FIG. 3.

As will be apparent from FIG. 2, it is permissible to modify the step of FIG. 1C, where the p-type ohmic electrodes 13 were formed only in selected regions, by covering the entire area of the p-type semiconductor layer 12 with a continuous ohmic electrode layer 13A as shown in FIG. 3. There is no need of modifying the subsequent steps, and a resultant light-emitting semiconductor chip 20A of FIG. 4 is identical with the chip 20 of FIG. 2 both in function and construction except for an enlargement in area of the p-type ohmic electrode 13A. Of course the materials used in Example 1 are merely exemplary. A repetition of Example 1 except for the use of nitrogen in place of the oxygen at the step of growing the p-type GaP layer gave a green light-emitting diode chip. A GaAsP light-emitting semiconductor chip can be fabricated by replacing the n-type GaP layer 11 with an epitaxially grown n-type GaAsP layer and the p-type GaP layer 12 with a p-type GaAsP layer formed by diffusion. An infrared-emitting semiconductor chip can be obtained by using GaAs as the material for the substrate 10, n-type layer 11 and p-type layer 12.

EXAMPLE 2

Figure 6:
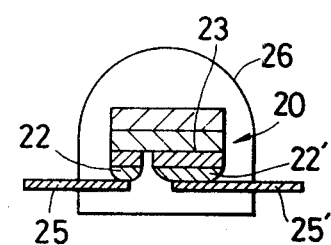
FIG. 6 shows a light-emitting semiconductor device, which utilizes the chip of FIG. 2, as an embodiment of the invention.

FIG. 6 shows a light-emitting semiconductor device utilizing the flip-chip type semiconductor chip 20 of FIG. 2 (or the chip 20A of FIG. 4) and a conventional lead frame which can provide two terminals as indicated at 25 and 25'. The flip-chip type semiconductor chip 20 was placed upside down on the lead frame, and the solder bumps 22 and 22' were bonded respectively to the two regions 25 and 25' of the lead frame. The device was completed by the provision of a suitably designed synthetic resin lens 26 in such an arrangement that light emitted at the p-n junction 23 formed right above the solder bump 22' or p-type ohmic electrode 13 could be well recognized from the substrate side.

A light-emitting semiconductor device of this construction has sufficiently high reliability and, besides, is very good at productivity because of the possibility of making connections at the two electrodes by a single step procedure.

EXAMPLE 3

Figure 7A:
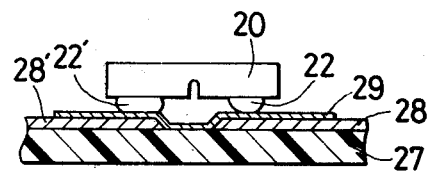
FIGS. 7A-7C show sequential steps in the fabrication of a light-emitting semiconductor device as another embodiment of the invention by utilizing a printed board and the chip of FIG. 2.
Figure 7B:
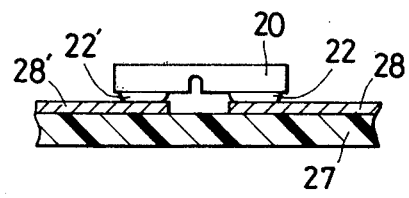
Figure 7C:
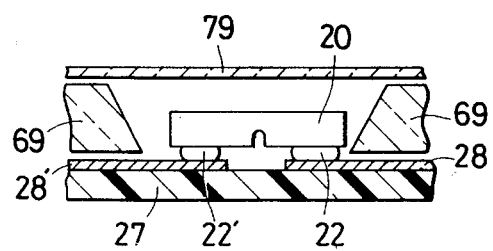

FIGS. 7A–7C show an example of applications of the light-emitting semiconductor chip 20 to devices utilizing a printed board.

In preparation for mounting of the semiconductor chip 20 on a printed board 27 having conducting lanes 28, 28' of a desired pattern, a suitable flux 29 was applied onto the conducting lanes 28, 28'. Then the chip 20 was placed upside down on the printed board 27 with the solder bumps 22 and 22' positioned respectively on the conducting lanes 28 and 28' as shown in FIG. 7A. The flux 29 served for provisional fixing of the chip 20 to the printed board 27 but, if necessary, heating to about 100° C. may be effected to enhance the adhesive ability of the flux 29. Next, the printed board 27 with the chip 20 placed thereon was heated in a conveyor furnace (not shown) at about 300° C. for a certain period of time required to melt the solder bumps 22, 22' thereby to bond the chip 20 to the conducting lanes 28, 28, of the board 27. Thereafter the surface of the board 27 was cleansed with an organic solvent to completely remove from the flux 29. FIG. 7B shows a state after these bonding steps. Finally, a reflector (or reflectors) 69 was placed beside the chip 20 on the printed board 27 so as to reflect upwards light radiated from the side face of the chip 20, followed by the provision of a transparent cover or hood 79 above the chip 20 and the reflector 69.

As will have been understood from the above explanation, a plurality of chips 20 can be simultaneously bonded to a single printed board. The mounting of each chip 20 on the printed board can be accomplished with high precision because of a self-alignment effect produced upon melting of the solder bumps 22, 22'. On account of the elimination of wire bonding, a device represented by FIG. 7C has a high reliability and good productivity. On the same account, large freedom is afforded not only to the arrangement of the reflector 29 but also to the selection of a method for the attachment of the reflector to the board.

A light-emitting semiconductor device analogous to the device of FIG. 7C can be obtained by the use of a ceramic substrate in place of the printed board 27.

Figure 5:
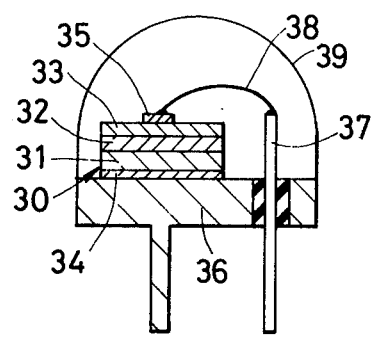
FIG. 5 is a sectional view of a conventional light-emitting semiconductor device.

For the sake of comparison, FIG. 5 shows a conventional light-emitting diode which corresponds in function to the device of FIG. 6. An n-type semiconductor layer 32 is formed on one side of a substrate 31 of an n-type semiconductor, and an ohmic electrode layer 34 for the n-type layer 32 is formed on the opposite side of the substrate 31. A p-type semiconductor layer 33 is formed on the n-type semiconductor layer 32, and a p-type ohmic electrode layer 35 is formed on the outer surface of the p-type semiconductor layer 33. A chip 30 thus constructed is mounted on a stem 36 by a die-bonding technique with the n-type ohmic electrode layer 34 contacted with an electrode surface of the stem 36, and a fine wire 38 connects the p-type ohmic electrode 35 to a metal post 37 which is attached to the stem 36 with insulation therebetween. Indicated at 39 is a lens. It will be obvious that the device of FIG. 5 suffers from poor productivity and insufficient reliability because of the employment of wire bonding.

EXAMPLE 4

This example shows a modification of the fabrication technique illustrated by Example 1 with the object of providing a light-emitting chip in which a junction is formed between an n-type semiconductor layer and a semi-insulating layer having a resistivity exceedingly higher than that of the n-type layer. Reference will be made to FIGS. 8A–8G.

Figure 8A:
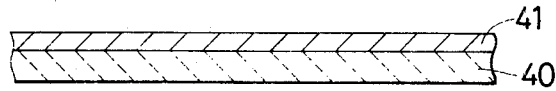
FIGS. 8A-8G show sequential steps in the fabrication of a light-emitting semiconductor chip which is of a different type from the chip of FIG. 2 but is also in accordance with the invention.
Figure 8B:
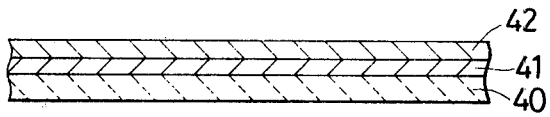
Figure 8C:
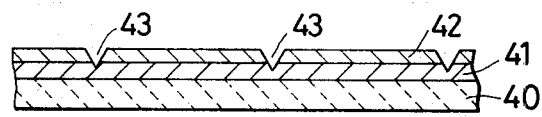
Figure 8D:
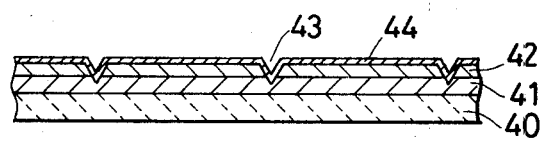
Figure 8E:
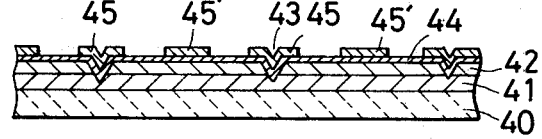
Figure 8F:
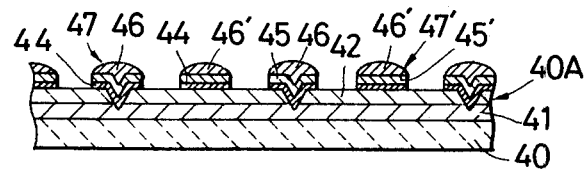

At the first step shown in FIG. 8A, an n-type semiconductor layer 41 was formed on a sapphire substrate 40 to a thickness of 10–100 $\mu$m by vapor phase growth of GaN in which $n \approx 10^{18}$ cm$^{-3}$. Then a semi-insulating layer 42 (will be referred to as i-type layer) was formed on the n-type layer 41, as shown in FIG. 8B, in one case by vapor phase growth of GaN doped with a p-type impurity (an impurity which participates in emission of light) such as Zn and in another case by diffusion (ion implantation may alternatively be employed) of a p-type impurity into the n-type layer 41 from the surface thereof. The thickness of the i-type layer 42 was about 10 $\mu$m or below. At the next step shown in FIG. 8C, the thin i-type layer 42 was scribed by means of a diamond stylus scriber to form a plurality of parallel and cross-sectionally V-shaped slots 43 at regular intervals. The scribing was made so deep that the bottom of each slot 43 was in the n-type layer 41. At the next step shown in FIG. 8D, a thin layer 44 of a metal serving as an ohmic electrode layer was formed on the outer surface of the i-type layer 42 such that the surfaces of the slots 43, too, were coated with this metal layer 44. In this example this layer 44 was formed by vacuum evaporation of Al to a thickness of about 5000 Å. Then the electrode layer 44 was selectively coated with a metal resistant to or compatible with a molten solder (in this example Ni was deposited by vacuum evaporation to a thickness of about 5000 Å) so as to provide a group of coatings 45 on the electrode layer 44 each in a region containing one of the slots 43 and another group of coatings 45' each spaced from the coatings 45 and located in a flat region between two slots 43 as shown in FIG. 8E. Thereafter, a suitable flux (not shown) was applied onto the surfaces of the metal coatings 45, 45', and a wafer 40A thus processed was dipped in a solder bath (not shown). By way of example, use was made of a 60% Sn-40% Pb solder at a bath temperature of about 250° C. The dipping was repeated several times each time for a period of few seconds. As the result, two groups of solder bumps 46 and 46' were built up respectively on the two groups of metal coatings 45 and 45' as shown in FIG. 8F, and each of the solder bumps 46 filled up each slot 43. During this process, the uncoated portion of the aluminum electrode layer 44 was mostly etched off by the solder, and the removal of this portion of the aluminum layer 44 was completed by a subsequent chemical etching process. The Ni coatings 45, 45' protected the underlying portions of the Al layer 44 against erosion by the solder. Thus the wafer 40A in FIG. 8F was provided with first electrodes 47 for the n-type layer 41 in the slotted regions and second electrodes 47' for the i-type layer 42 spaced from and arranged alternately with the first electrodes 47. Then the wafer 40A was diced as indicated at 48 in FIG. 8G into a plurality of chips 49 each having one of the first electrodes 47 and one of the second electrodes 47'. If desired, the dicing may be performed so as to give chips each having two or more of the first electrodes 47 and the same number of second electrodes 47'. The GaN light-emitting chip 49 emitted blue light when a potential was applied between the first electrode 47 and the second electrode 47'. A light-emitting device of this type will hereinafter be called a m-i-n type device.

Figure 10:
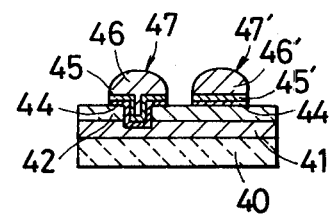
Figure 11:
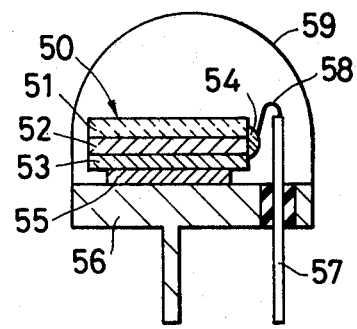
FIG. 11 is a sectional view of another conventional light-emitting semiconductor device.

As will be understood, the slots 43, the electrodes 47 and 47' illustrated in FIGS. 8C-8F can be formed on various patterns. FIGS. 10 and 11 show an example, wherein each slot 43 is a linear one and both the first and second electrodes 47, 47' were circular in plan view.

FIG. 11 shows a conventional light-emitting semiconductor device of m-i-n type for the sake of comparison. This device has an n-type semiconductor layer 52 formed on a sapphire substrate 51, an i-type layer 53 (a semi-insulating layer) on the n-type layer 52 and a metal electrode layer 55 on the outer surface of the i-type layer 13, and an ohmic electrode 54 is formed on the side face of the n-type semiconductor layer 52. A chip 50 thus constructed is mounted on a stem 56 with the metal electrode layer 55 contacted with an electrode surface of the stem 56 by utilizing a die-bonding technique, and a fine wire 58 is used to connect the n-type ohmic electrode 54 to a metal post 57 which is attached to the stem 56 with insulation therebetween. Indicated at 59 is a lens which is attached to the stem 56 to enclose the chip 50.

Figure 8G:
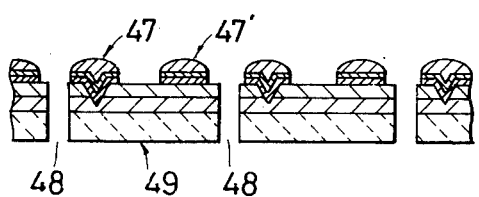
Figure 9:
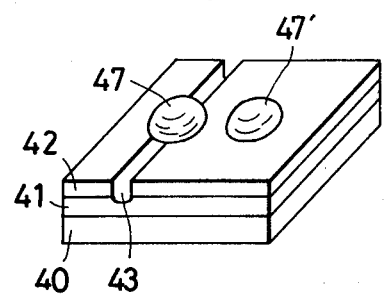
FIGS. 9 and 10 are respectively perspective and sectional views of an example of a semiconductor chip obtained through the steps of FIGS. 8A-8G.

It will be understood that the chip 50 is functionally equivalent to the chip 49 of FIG. 8G. However, the device of FIG. 11 is poor in productivity because of the need of forming the ohmic electrode 54 on the side face and using the fine wire 58 for electrical connection. Besides, reliability of this device remains on an insufficient level due to the wire bonding.

A basic thought of the invention can be put into practice also in cases where solder bumps can be dispensed with.

Figure 12:
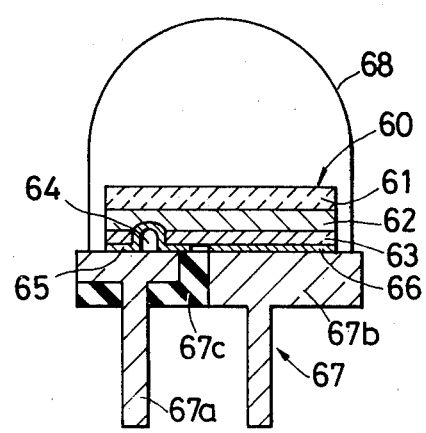
FIG. 12 is a sectional view of a device according to the invention as a counterpart of the device of FIG. 11.
Figure 13:
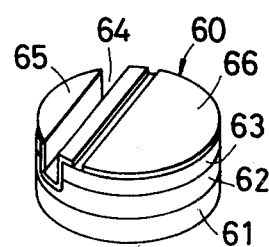
FIG. 13 is a perspective view of a light-emitting semiconductor chip used in the device of FIG. 12.

By way of example, FIG. 12 shows a m-i-n type light-emitting device embodying the thought of the invention with omission of solder bumps. In this device a light-emitting semiconductor chip 60 has a sapphire substrate 61, an n-type semiconductor layer 62 (such as of GaN) on the substrate 61 and an i-type layer 63 on the n-type layer 52. The i-type layer 63 is selectively removed together with a surface region of the n-type semiconductor layer 62 to give a recess 64, which takes the form of a linear slot in this case as shown in FIG. 13. As the result, the n-type layer 62 is exposed at the bottom of this recess 64. The depth of the recess 64 must be greater than the thickness of the i-type layer 63 but otherwise has no particular limitation: it is permissible that the recess 64 reaches the substrate 61. An ohmic electrode layer 65 (for the n-type layer 62) is formed so as to cover the surfaces of the recess 64 and a limited region (in which the recess 64 is formed) of the outer surface of the i-type layer 63. The n-type ohmic electrode layer 65 may cover the surfaces of the recess 64 either entirely or only partly (for example, only over a portion of the entire length of the slot 64) insofar as the electrode layer 65 continues from the outer surface of the i-type layer 63 to the exposed surface of the n-type layer 62. A metal electrode layer 66 is formed on the uncovered region of the surface of the i-type layer 63 so as to be electrically isolated from the n-type ohmic electrode layer 65. Thus, this chip 60 has two electrode layers 65 and 66 on the same surface.

A stem 67 shown in FIG. 12 has a first electrode 67a for the n-type semiconductor layer 62 of the chip 60 and a second electrode 67b for the i-type layer 63 with an insulator 67c therebetween. A surface of the first electrode 67a and a surface of the second electrode 67b lie in the same plane. The chip 60 is mounted on this stem 67 such that the n-type ohmic electrode layer 65 and the other electrode layer 66 are brought into contact with the first electrode 67a and the second electrode 67b, respectively, by utilizing a die-bonding technique to establish electrical connections between the chip 60 and the stem 67. A light-emitting semiconductor device is completed by the attachment of a lens 68 to the stem 67 to enclose the mounted chip 60.

When a negative voltage is applied to the first electrode 67a and a positive voltage to the second electrode 67b, the device or chip 60 of FIG. 12 is forward-biased and emits light as can be understood from the illustration.

The device of FIG. 12 is not novel in the principle of light-emission but is markedly superior to conventional devices on the same principle both in reliability and in productivity since this device employs no wire bonding.

FIGS. 14A-14F illustrate a method of industrially fabricating a m-i-n type light-emitting chip similar to the chip 60 in FIGS. 12 and 13 but rectangular in plan view geometry.

At the first step down in FIG. 14A, an n-type semiconductor layer 62 is formed on a sapphire substrate 61 by a known technique, and at the next step an i-type or semi-insulating layer 63 is formed on the n-type layer 62 as seen in FIG. 14B. Then the i-type layer 63 is removed in selected regions together with a surface portion of the n-type layer 62 as shown in FIG. 14C so as to give a plurality of identical recesses 64 (linear and parallel slots) at regular intervals. The method of performing the step of FIG. 14C is also optional, and, for example, use may be made of a dicer, scriber, ultrasonic cutter or a selective etching technique. Then, as seen in FIG.

14D, a metal layer 70 which can serve as an ohmic electrode for an n-type semiconductor is formed on the entire region of the i-type layer 63 so as to cover the surfaces of the recesses 65, too. At the next step shown in FIG. 14E, the metal layer 70 is selectively removed so as to provide a plurality of identical gaps 72 respectively at a short distance from the recesses 64, meaning that the gaps 72 are formed at the same intervals as the recesses 64. The selective removal of the metal layer 70 is made deep enough to expose the i-type layer 63 in the gaps 72 by either a mechanical means such as a dicer or chemical etching. Referring to FIG. 14F, a wafer 71 obtained through the steps of FIGS. 14A–14E is cut along cutting lines 74 into a plurality of identical chips 60A, for example, by dicing or scribing such that each chip 60A has a single recess 64 and a single gap 72. In the thus fabricated chips 60A, the gap 74 patitions the metal layer 70 into two regions, one serving as the n-type ohmic electrode layer 65 in FIG. 12 and the other as the metal electrode layer 66.

It will be easily understood that the above described method is applicable also to the fabrication of a p-n junction light-emitting device according to the invention such as a device shown in FIG. 15.

In the device of FIG. 15, a light-emitting semiconductor chip 80 has an n-type semiconductor layer 82 such as of GaAs, Ga(AsP) or GaP formed on a substrate 81 of an n-type semiconductor and a p-type semiconductor layer 83 on the n-type layer 82. The p-type layer 83 is selectively removed together with a surface region of the n-type layer 82 to give a recess 84, resulting in the exposure of the n-type layer 82 at the bottom of the recess 84. This recess 84 corresponds to the recess 64 in FIG. 12, so that the description about the shape and depth of the recess 64 applies also to this recess 84. Another recess 89 is formed in the p-type layer 83 to a depth greater than the thickness of this layer 83 such that the p-type layer 83 is divided into a first region containing the former recess 84 and a second region completely spaced from the first region. In the first region, an n-type ohmic electrode layer 85 extends from the outher surface of the p-type layer 83 to the n-type layer 82 exposed in the recess 84, and in the second region a p-type ohmic electrode layer 86 is formed on the outer surface of the p-type layer 83. Neither of the ohmic electrode layers 85 and 86 extends into the recess 89, so that the n-type ohmic electrode layer 85 is isolated from the second region of the p-type layer 83. As a consequence the p-type layer 83 is effective (in the sense of participating in the emission of light) only in the second region.

The chip 80 is mounted on a stem 87, which is similar to the stem 67 in FIG. 12, such that the n-type and p-type ohmic electrode layers 85 and 86 come into contact with first and second electrodes 87a and 87b, respectively. Indicated at 87c is an insulator in the stem 87 and at 88 is a lens.

EXAMPLE 5

Produced in this example were m-i-n type light-emitting devices constructed as shown in FIG. 12. The n-type semiconductor layer 62 was formed by vapor phase growth of GaN, in which $n \approx 10^{18}$ cm$^{-3}$, on the sapphire substrate 61 to a thickness of 10–100 μm. The i-type layer 63 was formed in one case by vapor phase growth of GaN doped with a p-type impurity such as Zn and in another case by diffusion of a p-type impurity into the n-type layer 62 from the outer surface thereof.

The n-type ohmic electrode layer 65 and the metal electrode layer 36 on the i-type layer 63 were formed by vacuum evaporation of Au, In or Sn. In some cases a double-layer contact was formed by first depositing W, Mo or Cr on the i-type layer 63 and then depositing Ay, In or Sn on the initially deposited metal film. The chip 60 was mounted on the stem 67 by a thermo-compression bonding technique.

The devices produced in this example emitted blue light.

EXAMPLE 6

This example relates to a p-n junction devices as shown in FIG. 15.

The substrate 81 was of n-type GaP single crystal in which $n \approx 5 \sim 20 \times 10^{17}$ cm$^{-3}$, and the n-type semiconcutor layer 82 was a 30–50 μm thick layer of GaP doped with an n-type impurity such as Te to a concentration n of about $10^{18}$ cm$^{-3}$. The p-type semiconductor layer 83 was a 30–50 μm thick layer of GaP doped with Zn and O as p-type impurities to a total concentration of about $5 \times 10^{17}$ cm$^{-3}$. Use was made of a Au-Sn alloy as the n-type ohmic electrode 85 and a Au-Be alloy as the p-type ohmic electrode 86.

In preparation for mounting of the semiconductor chip 80 on the stem 87, both the n-type and p-type ohmic electrodes 85 and 86 were plated with Ni, and a Pb-Sn solder bump was formed on the Ni coating for each of the ohmic electrodes 85, 86. The mounting was accomplished either by thermo-compression bonding or by heat treatment. The product of this example was a red light-emitting diode.

EXAMPLE 7

This example too relates to a p-n junction diode. The n-type semiconductor layer 82 was of a GaP layer dopes with N and S to a total concentration n of about $10^{17}$ cm$^{-3}$, and the p-type semiconductor layer 83 was of a GaP layer doped with N and Zn to a total concentration p of about $10^{17}$ cm$^{-3}$. In other respects this example was a repetition of Example 6, but the diode produced in this example emitted yellowish green light.

EXAMPLE 8

This example was another modification of Example 6. In this case the n-type semiconductor layer 82 was of Te-doped GaAs$_{0.4}$P$_{0.6}$ grown from vapor phase on the GaP substrate 81 by gradually varying the amount of P in GaAsP. The p-type semiconductor layer 83 was a p-type GaAs$_{0.4}$P$_{0.6}$ layer formed by diffusion of Zn into the n-type layer from the surface thereof.

What is claimed is:

1. A light-emitting semiconductor device comprising:
   a substrate;
   a first semiconductor layer which is formed on said substrate; said first semiconductor layer being continuous;
   a second semiconductor layer which is different in conductivity from said first layer and is formed on the outer surface of said first layer, said second layer being formed with a recess which is deeper than the thickness of said second layer, said recess being formed by removal of said second layer in a selected area and by removal of a surface portion of said first layer such that surfaces of said second layer are exposed and a subsurface portion of said first layer is uncovered and serves as the bottom of said recess;

a first electrode layer selectively covering the outer surface of said second semiconductor layer and extending into said recess so as to cover the exposed surfaces of said second semiconductor layer and said subsurface portion of said first semiconductor layer;

a second electrode layer selectively covering the outer surface of said second semiconductor layer so as to be separated from said first electrode layer;

a first solder bump built up on said first electrode layer and filling up said recess; and a second solder bump built up on said second electrode layer and being separated from said first solder bump.

2. A light-emitting device as claimed in claim 1, further comprising a metal coating on each of said first and second electrode layers, the material of said metal coating being compatible with a molten material for said first and second solder bumps.

3. A light-emitting device as claimed in claim 1, further comprising a stem having two electrical terminals substantially in the same plane, said first and second solder bumps being welded respectively to said two electrical terminals.

4. A light-emitting device as claimed in claim 3, further comprising a curved and light-transmitting member mounted on said stem to enclose the combination of said substrate, first and second semiconductor layers and first and second electrode layers.

5. A light-emitting device as claimed in claim 2, further comprising a circuit board having two conducting lanes on one side thereof, said first and second solder bumps being welded respectively to said two conducting lanes.

6. A light-emitting device as claimed in claim 5, further comprising at least one light-reflecting member mounted on said circuit board to be positioned beside the combination of said substrate, first and semiconductor layers and first and second electrode layers.

7. A light-emitting device as claimed in claim 6, further comprising a light-transmitting plate mounted on said circuit board with the interposal of said combination and said light-reflecting member therebetween.

8. A light-emitting semiconductor device comprising:
a substrate;
a first semiconductor layer of n-type conductivity which is formed on said substrate; said first semiconductor layer being continuous;
a second semiconductor layer which is a semiinsulating layer higher in resistivity than said first layer and is formed on the outer surface of said first layer, said second layer being formed with a recess which is deeper than the thickness of said second layer, said recess being formed by removal of said second layer in a selected area and by removal of a surface portion of said first layer such that surfaces of said second layer are exposed and a subsurface portion of said first layer is uncovered and serves as the bottom of said recess;
a first metal electrode layer selectively covering the outer surface of said second semiconductor layer and extending into said recess so as to cover the exposed surfaces of said second semiconductor layer and said subsurface portion of said first semiconductor layer;
a second metal electrode layer selectively covering the outer surface of said second semiconductor layer so as to be separated from said first electrode layer;
a first solder bump built up on said first electrode layer and filling up said recess; and
a second solder bump built up on said second electrode layer and being separated from said first solder bump.

9. A light-emitting device as claimed in claim 8, further comprising a metal coating on each of said first and second electrode layers, the material of said metal coating being compatible with a molten material for said first and second solder bumps.

10. A light-emitting device as claimed in claim 9, further comprising a stem having two electrical terminals substantially in the same plane, said first and second solder bumps being welded respectively to said two electrical terminals.

11. A light-emitting device as claimed in claim 9, further comprising a circuit board having two conducting lanes on one side thereof, said first and second solder bumps being welded respectively to said two conducting lanes.

12. A light-emitting semiconductor device comprising:
a substrate;
a first semiconductor layer of n-type conductivity which is formed on said substrate; said first semiconductor layer being continuous;
a second semiconductor layer of p-type conductivity which is formed on the outer surface of said first layer; said second semiconductor layer being formed with a recess which is deeper than the thickness of said second layer, said recess being formed by removal of said second layer in a selected area and by removal of a surface portion of said first layer such that surfaces of said second layer are exposed and a subsurface portion of said first layer is uncovered and serves as the bottom of said recess;
said first and second layers being formed with a groove by removal of said second layer together with a surface portion of said first layer such that said groove divides said second layer into a first portion containing said recess and a second portion that lacks said recess;
a first metal electrode layer which covers the outer surface of said first portion and which extends into said recess so as to completely cover the exposed surfaces of said second semiconductor layer and said subsurface portion of said first semiconductor layer;
a second metal electrode layer which covers the outer surface of said second portion;
a first solder bump built up on said first portion and filling up said recess; and
a second solder bump built up on said second portion and being separated from said first solder bump.

13. A light-emitting device as claimed in claim 12, further comprising a metal coating on each of said first and second electrode layers, the material of said metal coating being compatible with a molten material for said first and second solder bumps.

14. A light-emitting device as claimed in claim 13, further comprising a stem having two electrical terminals substantially in the same plane, said first and second solder bumps being welded respectively to said two electrical terminals.

15. A light-emitting device as claimed in claim 13, further comprising a circuit board having two conducting lanes on one side thereof, said first and second solder bumps being welded respectively to said two conducting lanes.

16. A light-emitting semiconductor device comprising:
- a substrate;
- a first semiconductor layer of n-type conductivity which is formed on said substrate; said first semiconductor layer being continuous;
- a second semiconductor layer of p-type conductivity which is formed on the outer surface of said first layer and has a thickness of 30–50 $\mu$m; said second semiconductor layer being formed with a recess which is deeper than the thickness of said second layer, said recess being formed by removal of said second layer in a selected area and by removal of a surface portion of said first layer such that surfaces of said second layer are exposed and a subsurface portion of said first layer is uncovered and serves as the bottom of said recess;
- said first and second layers being formed with a groove by removal of said second layer together with a surface portion of said first layer such that said groove divides said second layer into a first portion containing said recess and a second portion that lacks said recess;
- a first metal electrode layer which covers the outer surface of said first portion and which extends into said recess so as to cover the exposed surfaces of said second semiconductor layer and said subsurface portion of said first semiconductor layer; and
- a second metal electrode layer which covers the outer surface of said second portion.

* * * * *